(12) United States Patent
Zhang et al.

(10) Patent No.: US 12,482,424 B2
(45) Date of Patent: Nov. 25, 2025

(54) DISPLAY DEVICE

(71) Applicant: Shenzhen China Star Optoelectronics Semiconductor Display Technology Co., Ltd., Guangdong (CN)

(72) Inventors: Peng Zhang, Guangdong (CN); Yuanjun Hsu, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 106 days.

(21) Appl. No.: 17/298,633

(22) PCT Filed: May 10, 2021

(86) PCT No.: PCT/CN2021/092717
§ 371 (c)(1),
(2) Date: Oct. 27, 2022

(87) PCT Pub. No.: WO2022/222204
PCT Pub. Date: Oct. 27, 2022

(65) Prior Publication Data
US 2024/0013727 A1  Jan. 11, 2024

(30) Foreign Application Priority Data

Apr. 23, 2021 (CN) .......................... 202110463324.9

(51) Int. Cl.
G09G 3/3266 (2016.01)
H10K 59/121 (2023.01)
(Continued)

(52) U.S. Cl.
CPC ....... *G09G 3/3266* (2013.01); *H10K 59/1213* (2023.02); *H10K 59/1216* (2023.02); *H10K 59/126* (2023.02); *H10K 59/131* (2023.02)

(58) Field of Classification Search
CPC ........... H10K 59/1213; H10K 59/1216; H10K 59/126; H10K 59/131; G09G 3/20;
(Continued)

(56) References Cited

U.S. PATENT DOCUMENTS

2002/0158829 A1\* 10/2002 Yamazaki .............. H10D 86/00
345/92
2012/0153289 A1  6/2012 Kancko
(Continued)

FOREIGN PATENT DOCUMENTS

CN   106097949   11/2016
CN   106920804   7/2017
(Continued)

*Primary Examiner* — Brigitte A Paterson

(57) ABSTRACT

A display device is provided. A display panel includes a display device. The display device is provided with a gate driving area. The gate driving area is provided with a first transistor device. The first transistor device includes a first signal wire and a second signal wire. The first signal wire is electrically connected to a gate layer. The second signal wire is electrically connected to a first metal layer. Therefore, a double-gate structure, which can provide a large-current gate signal by only the second signal wire, is formed. Or, the double-gate structure can provide a large-current gate signal by both the first signal wire and the second signal wire. As a result, mobility of an active layer is improved.

20 Claims, 5 Drawing Sheets

(51) Int. Cl.
*H10K 59/126* (2023.01)
*H10K 59/131* (2023.01)

(58) Field of Classification Search
CPC ............. G09G 3/3233; G09G 3/3266; G09G 2300/0408; G09G 2300/0426; G09G 2310/0286; H10D 86/021; H10D 86/423; H10D 86/471; H10D 86/441; H10D 86/60
See application file for complete search history.

(56) References Cited

U.S. PATENT DOCUMENTS

| | | | |
|---|---|---|---|
| 2016/0071463 A1* | 3/2016 | Takahashi | G09G 3/3275 327/109 |
| 2018/0040682 A1* | 2/2018 | Ebisuno | H10K 59/8791 |
| 2018/0069069 A1* | 3/2018 | Ebisuno | H10K 59/352 |
| 2020/0052129 A1* | 2/2020 | Miyake | H10D 86/423 |
| 2020/0286927 A1 | 9/2020 | Park | |

FOREIGN PATENT DOCUMENTS

| | | |
|---|---|---|
| CN | 111192884 | 5/2020 |
| CN | 111445846 | 7/2020 |
| CN | 112117309 | 12/2020 |
| CN | 112466948 | 3/2021 |

* cited by examiner

DISPLAY DEVICE

RELATED APPLICATIONS

This application is a National Phase of PCT Patent Application No. PCT/CN2021/092717 having International filing date of May 10, 2021, which claims the benefit of priority of Chinese Patent Application No. 202110463324.9 filed on Apr. 23, 2021. The contents of the above applications are all incorporated by reference as if fully set forth herein in their entirety.

FIELD AND BACKGROUND OF THE INVENTION

The present disclosure relates to the field of display technologies, and more particularly, to a display device.

Oxide thin-film transistors (TFTs) have large size, resulting in a large-area requirement when manufacturing the oxide TFTs. The oxide TFTs commonly have a top-gate structure. However, in large-scale display panels, a voltage of TFTs will be reduced if wires of the TFTs are too long, leading to a voltage of a gate driving area being less than a gate voltage of the TFTs. Therefore, circuits in the gate driving area cannot work due to a negatively shifted voltage. To ensure that a display area can work normally, an output scan signal voltage of the gate driving area is increased. However, if doing so, current in the gate driving area will be overly large, and a driving circuit will be burned out.

In circuits of a common gate driving area, a drain electrode is connected to a shielding layer. The shielding layer and a top gate form a gate electrode together after they are connected to each other. Therefore, the shielding layer supplies current to open a channel of an active layer. Because IGZO oxide transistors have relatively bad stability when being irradiated with light, performance of the transistors is easily changed, which makes stability unable to be ensured and results in abnormality of transporting signals. Therefore, a stage-shift failure occurs easily. Furthermore, electrical signals supplied by the above structure to a shielding layer are data signals connected to a source electrode. A channel of the active layer can be really opened only if a top gate is connected to a gate signal. A negatively shifted voltage of a transistor occurs when the data signals connected to the source electrode are connected to the gate signals early or late. Therefore, it is difficult to precisely control the channel of the active layer. Moreover, the above structure cannot provide large-current gate signals to the top gate and cannot provide large-current data signals to the shielding layer, resulting in low mobility of the active layer. However, if the top gate is provided with large-current gate signals or the shielding layer is provided with large-current data signals, driving circuits of a gate driving area will be burned out due to overly-large currents. Therefore, a maximum voltage value of scan signals output through the gate driving area is severely limited, As a result, it is necessary to develop a novel display device to overcome defects of conventional technologies.

SUMMARY OF THE INVENTION

An aim of the present disclosure is to provide a display device to solve a following issue: conventional oxide TFTs with a top-gate structure cannot provide large-current gate signals to a top gate and cannot provide large-current data signals to a shielding layer, resulting in low mobility of an active layer. However, if a top gate is provided with large-current gate signals or a shielding layer is provided with large-current data signals, driving circuits of a gate driving area will be burned out due to overly-large currents. Therefore, a maximum voltage value of scan signals output through the gate driving area is severely limited.

To achieve the above goal, an embodiment of the present disclosure provides a display device, including a display area and a non-display area surrounding a periphery of the display area. The gate driving area includes a gate driving circuit configured to drive the display area, the gate driving circuit includes an output pull-up module, the output pull-up module includes a first transistor device, the first transistor device includes a first metal layer, a buffer layer, an active layer, a gate insulating layer, a gate layer, an interlayer insulating layer, and a second metal layer. Specifically, the buffer layer is disposed on the first metal layer. The active layer is disposed on the buffer layer and corresponds to the first metal layer. The gate insulating layer is disposed on the active layer. The gate layer is disposed on the gate insulating layer and corresponds to the active layer. The interlayer insulating layer is disposed on the buffer layer and completely covers the gate layer. The second metal layer is disposed on the interlayer insulating layer and includes a source electrode, a drain electrode, a first signal wire, and a second signal wire. The source electrode is electrically connected to one end of the active layer. The drain electrode is electrically connected to another end of the active layer. The first signal wire is electrically connected to the gate layer to form a top-gate structure and is configured to input a first gate signal. The second signal wire is electrically connected to the first metal layer to form a bottom-gate structure and is configured to input a second gate signal.

Furthermore, the first signal wire is electrically connected to the second signal wire, and the first gate signal and the second gate signal are same.

Furthermore, positions of the buffer layer and the interlayer insulating layer corresponding to an end of the first metal layer are provided with a first through-hole, and the second signal wire is electrically connected to the first metal layer by the first through-hole.

Furthermore, the gate driving circuit further includes an input module, a voltage-stabilizing module, an output pull-down module, and a scan signal output terminal. The input module includes a first output terminal. The first output terminal outputs the first gate signal and the second gate signal to the out pull-down module. The output pull-down module is electrically connected to the output pull-up module. The scan signal output terminal is disposed between the output pull-down module and the output pull-up module and is configured to output a scan signal to the display area.

Furthermore, the first signal wire and the second signal wire of the first transistor device are electrically connected to the first output terminal of the input module, the drain electrode of the first transistor device inputs a clock signal, and the source electrode of the first transistor device is electrically connected to the scan signal output terminal and the output pull-down module.

Furthermore, the display area of the display device is provided with a plurality of scan lines and a plurality of data lines crossing the scan lines, a plurality of regions surrounded by the scan lines and the data lines are provided with a plurality of pixels distributed in an array manner, and each of the gate driving circuits is electrically connected to the pixels by one of the scan lines. Each of the pixels includes a pixel driving circuit, and the gate driving circuit and the scan lines are electrically connected to the pixel driving circuit configured to provide the scan signals.

Furthermore, the pixel driving circuit includes a switch transistor, a driving transistor, a storage capacitor, and a light-emitting component, a gate of the switch transistor is electrically connected to one of the scan lines, a drain electrode of the switch transistor is electrically connected to one of the data lines, a source electrode of the switch transistor is electrically connected to a gate of the driving transistor and an end of the storage capacitor, a drain electrode of the driving transistor is electrically connected to another end of the storage capacitor and inputs a first voltage signal, a source electrode of the driving transistor is electrically connected to a positive electrode of the light-emitting component, a negative electrode of the light-emitting component inputs a second voltage signal, the driving transistor has a same structure as the first transistor device.

Furthermore, the display device includes an array substrate. The array substrate includes a glass substrate, a passivation layer, a planarization layer, and a conductive layer. The gate driving area is formed on the glass substrate. The passivation layer is disposed on the interlayer insulating layer and completely covers the second metal layer. The planarization layer is disposed on the passivation layer. The conductive layer includes a first anode wire. The first anode wire is disposed on the planarization layer and is connected to the drain electrode.

Furthermore, the first transistor device further includes a line-changing layer and a pixel-defining layer. The line-changing layer is disposed on the passivation layer and is electrically connected to the drain electrode. The planarization layer is disposed on the passivation layer and completely covers the line-changing layer. The conductive layer is electrically connected to the line-changing layer. The pixel-defining layer is disposed on the conductive layer.

Furthermore, the gate driving area and the display area are further provided with a second transistor device and/or a third transistor device. The second transistor device and the second transistor device correspond to a plurality layers of the first transistor device. The gate driving circuit further includes an input module, an input pull-down module, a pull-down control module, and a feedback module. A plurality of transistors T1 of the pull-in module, the output pull-in module, the pull-in control module, and the pixel driving circuit have a same structure as the third transistor device. Wherein, the second transistor device includes a light-shielding layer, the buffer layer, the active layer, the gate insulating layer, the gate layer, the interlayer insulating layer, and the second metal layer. The light-shielding layer and the first metal layer are disposed on a same layer. The buffer layer is disposed on the first metal layer. The active layer is disposed on the buffer layer and corresponds to the light-shielding layer. The gate insulating layer is disposed on the active layer. The gate layer is disposed on the gate insulating layer and corresponds to the active layer. The interlayer insulating layer is disposed on the buffer layer and completely covers the gate layer. The source electrode is electrically connected to an end of the active layer. The drain electrode is electrically connected to another end of the active layer and the light-shielding layer. Wherein, the third transistor device includes the active layer, the gate insulating layer, the gate layer, the interlayer insulating layer, and the second metal layer. The active layer is disposed on the buffer layer and corresponds to the first metal layer. The gate insulating layer is disposed on the active layer. The gate layer is disposed on the gate insulating layer and corresponds to the active layer. The interlayer insulating layer is disposed on the buffer layer and completely covers the gate layer. The second metal layer is disposed on the interlayer insulating layer. The second metal layer includes a source electrode and a drain electrode. The source electrode is electrically connected to an end of the active layer. The drain electrode is electrically connected to another end of the active layer.

Furthermore, the gate driving area includes a first capacitor electrode plate, the first capacitor electrode plate and the first metal layer are disposed on a same layer, the second metal layer includes a second capacitor electrode plate, the active layer includes a third capacitor electrode plate, the first capacitor electrode plate is electrically connected to the second capacitor electrode plate, and the third capacitor electrode plate is correspondingly disposed between the first capacitor electrode plate and the second capacitor electrode plate to form a capacitor.

Furthermore, the gate driving area includes a first gasket wire, the first gasket wire and the first metal layer are disposed on a same layer, the second metal layer includes a second gasket wire, the second gasket wire is disposed above the first gasket wire and is electrically connected to the first gasket wire, the first transistor device further includes a third gasket wire, the third gasket wire is disposed above the second gasket wire and is electrically connected to the second gasket wire to form a bonding connecting gasket.

Regarding the beneficial effects: the present disclosure provides a display device. In the display device, a first transistor device of an output pull-up module of a gate driving circuit in a gate driving area is provided with a first signal wire and a second signal wire. The first signal wire is electrically connected to a gate layer. The second signal wire is electrically connected to a first metal layer. As a result, a double-gate structure is formed. The double-gate structure can provide a gate signal with a large current by only the second signal wire. Also, the double-gate structure can provide a gate signal with a large current by both the first signal wire and the second signal wire, thereby improving mobility of an active layer. Moreover, the above transistor device has a relatively stable structure. Therefore, mobility and stability of Vth of the transistor devices in the gate driving area can be improved, and the driving circuit of the gate driving area will not be burned out due to an overly large current. As such, a signal voltage value of the first transistor device can be increased, so that a value of a scan signal voltage transmitted from the gate driving area to the display area can be increased.

BRIEF DESCRIPTION OF THE SEVERAL VIEWS OF THE DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

Figure 1:
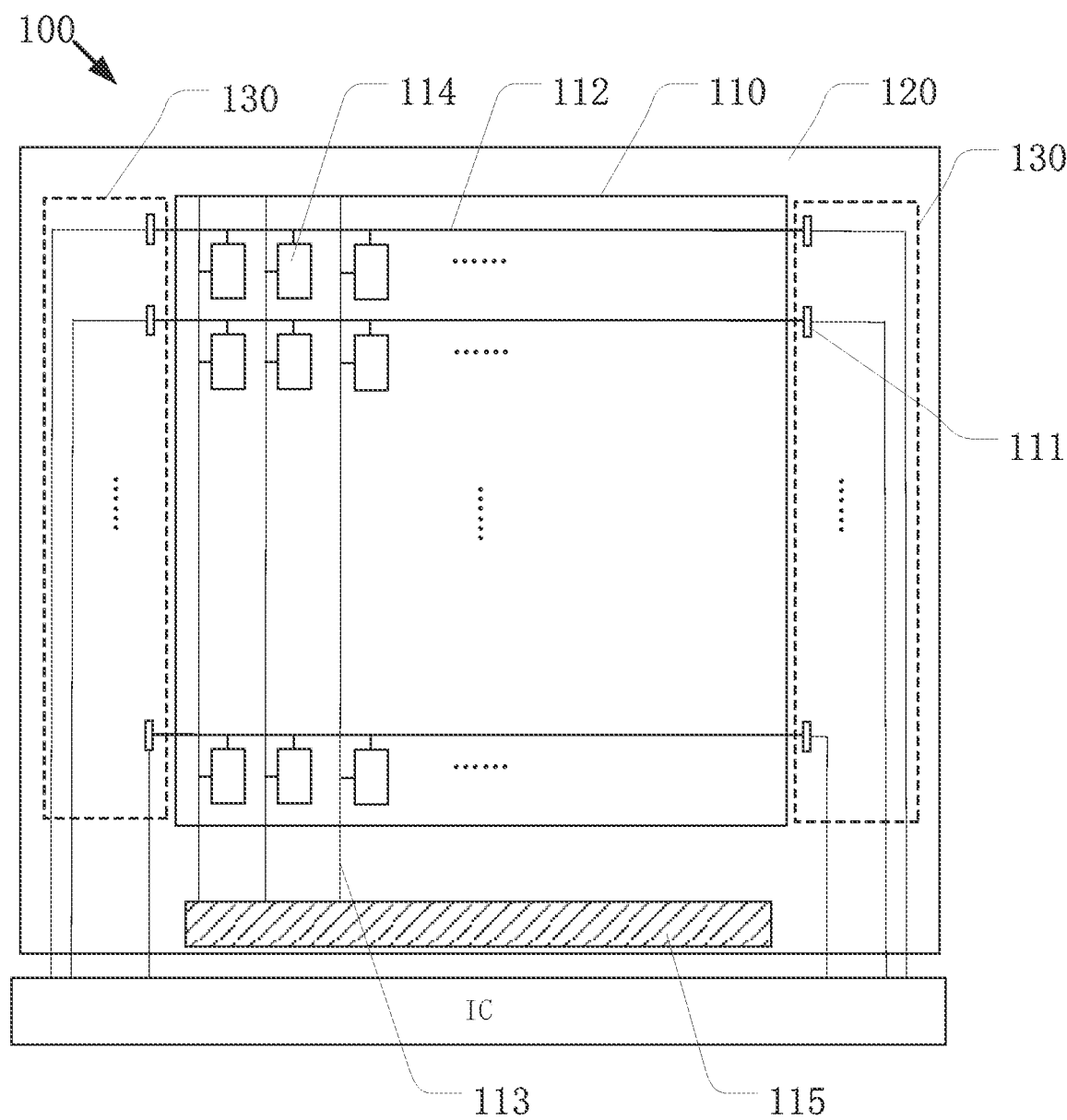
FIG. 1 is a plan structural schematic view showing a display device according to an embodiment of the present disclosure.

Reference numbers in the drawings are as follows:
glass substrate 1, first metal layer 21, light-shielding layer 22,
first capacitor electrode plate 23, first gasket wire 24, buffer layer 3,
input module 31, voltage-stabilizing module 32, output pull-up module 33,
output pull-down module 34, pull-down control module 35, feedback module 36,
active layer 4, third capacitor electrode plate 41, gate insulating layer 5,
gate electrode layer 6, interlayer insulating layer 7, second metal layer 8,
source electrode 81, drain electrode 82, first signal wire 83,
second signal wire 84, second capacitor electrode plate 85, second gasket wire 86,
passivation layer 9, line-changing layer 10, planarization layer 11,
conductive layer 12, first anode wire 121, second anode wire 122
third anode wire 123, pixel-defining layer 13, third gasket wire 14,
display device 100, first transistor device 101, second transistor device 102,
third transistor device 103, display area 110, gate driving circuit 111,
scan line 112, data line 113, pixel 114,
source driver chip 115, non-display area 120, and gate driving area 130.

DESCRIPTION OF SPECIFIC EMBODIMENTS OF THE INVENTION

Hereinafter a preferred embodiment of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure.

The identical or similar reference numerals constantly denote the identical or similar elements or elements having the identical or similar functions. It should be understood that terms such as "upper", "lower", "front", "rear", "left", "right", "inside", "outside", "upper surface", "lower surface", "lateral surface", "top side", "bottom side", "front end", "rear end, and", "end" should be construed to refer to the orientation as then described or as shown in the drawings under discussion. These relative terms are for convenience of description, do not require that the present disclosure be constructed or operated in a particular orientation, and shall not be construed as causing limitations to the present disclosure.

It should be noted that a structure in which a first feature is "on" a second feature may include an embodiment in which the first feature directly contacts the second feature and may also include an embodiment in which an additional feature is formed between the first feature and the second feature. It should be noted that a structure in which a first feature is "mounted on" or "connected to" a second feature may include an embodiment in which the first feature directly mounted on or connected to the second feature and may also include an embodiment in which the first feature is mounted on or connected to the second feature by an additional feature.

Please refer to FIG. 1. An embodiment of the present disclosure provides a display device 100. The display device 100 may be a mobile phone, a tablet, a television, a display, a laptop, a digital frame, a navigator, or any products or components with a display function.

Please refer to FIG. 1, the display device 100 includes a display area 110 and a non-display area 120 surrounding a periphery of the display area 110. The non-display area 120 is provided with a gate driving area 130. The gate driving area 130 includes a plurality of gate driving circuits 111 configured to drive the display area 110. The gate driving circuit 111 is electrically connected to a scan line 112 and is configured to provide a scan signal (Scan). The display area 110 is provided with a plurality of scan lines 112 and a plurality of data lines 113 crossing each other. A plurality of regions surrounded by the scan lines 112 and the data lines 113 are provided with a plurality of pixels 114. Each of the gate driving circuits 111 is electrically connected to the pixels 114 by one of the scan lines 112. A source driver chip 115 is electrically connected to the pixels 114 by at least one of the data lines 113. Each of the pixels 14 includes a pixel driving circuit which can have a 2T1C structure, a 3T1C structure, or a 7T1C structure.

Figure 2:
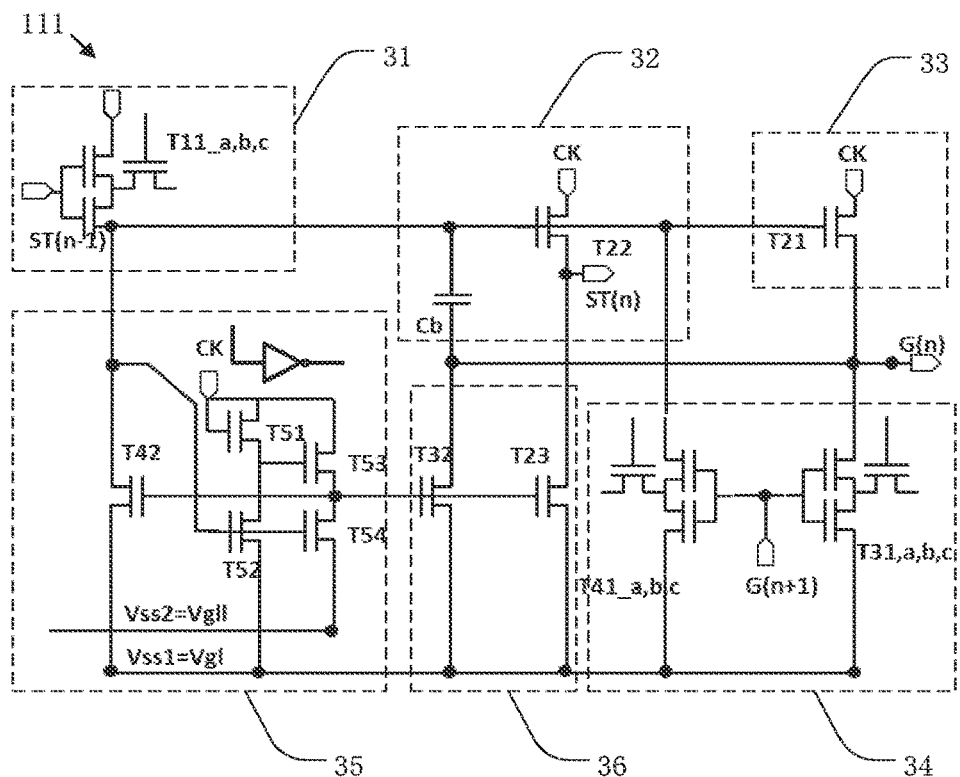
FIG. 2 is a structural schematic view showing a gate driving circuit according to the embodiment of the present disclosure.

Please refer to FIG. 2. FIG. 2 is a structural schematic view showing the gate driving circuit 111 provided by the present disclosure. The gate driving circuit 111 includes an input module 31, a voltage-stabilizing module 32, an output pull-up module 33, an output pull-down module 34, a pull-down control module 35, a feedback module 36, and a scan signal output terminal G(n). Wherein, the input module includes a first output terminal. The first output terminal outputs a first gate signal and a second gate signal into the output pull-up module 33. The voltage-stabilizing module 32 is disposed between the input module 31 and the output pull-up module 33 and is electrically connected to the feedback module 36. The pull-down control module 35 is connected to the feedback module 36 and the output pull-down module 34. The output pull-down module 34 is electrically connected to the output pull-up module 33. The scan signal output terminal G(n) is disposed between the output pull-down module 34 and the output pull-up module 33 and is configured to output a scan signal (Scan) to the display area 110.

Figure 3:
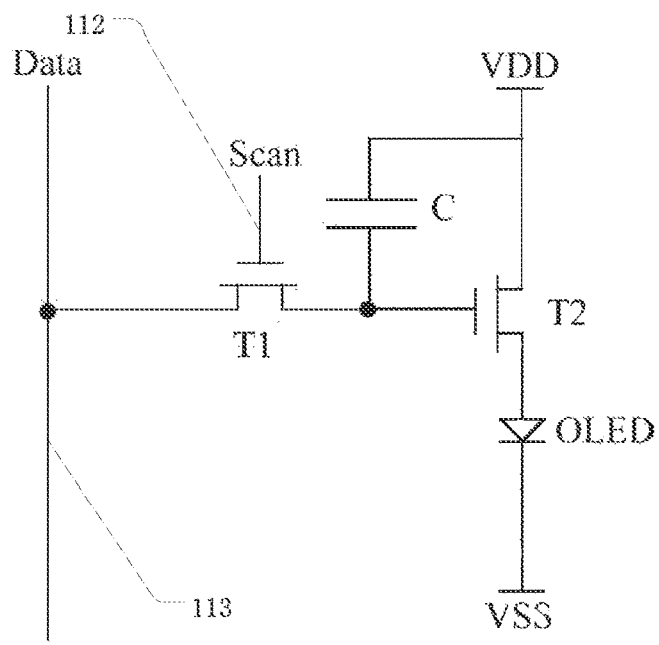
FIG. 3 is a structural schematic view showing a pixel driving circuit according to the embodiment of the present disclosure.
Figure 6:
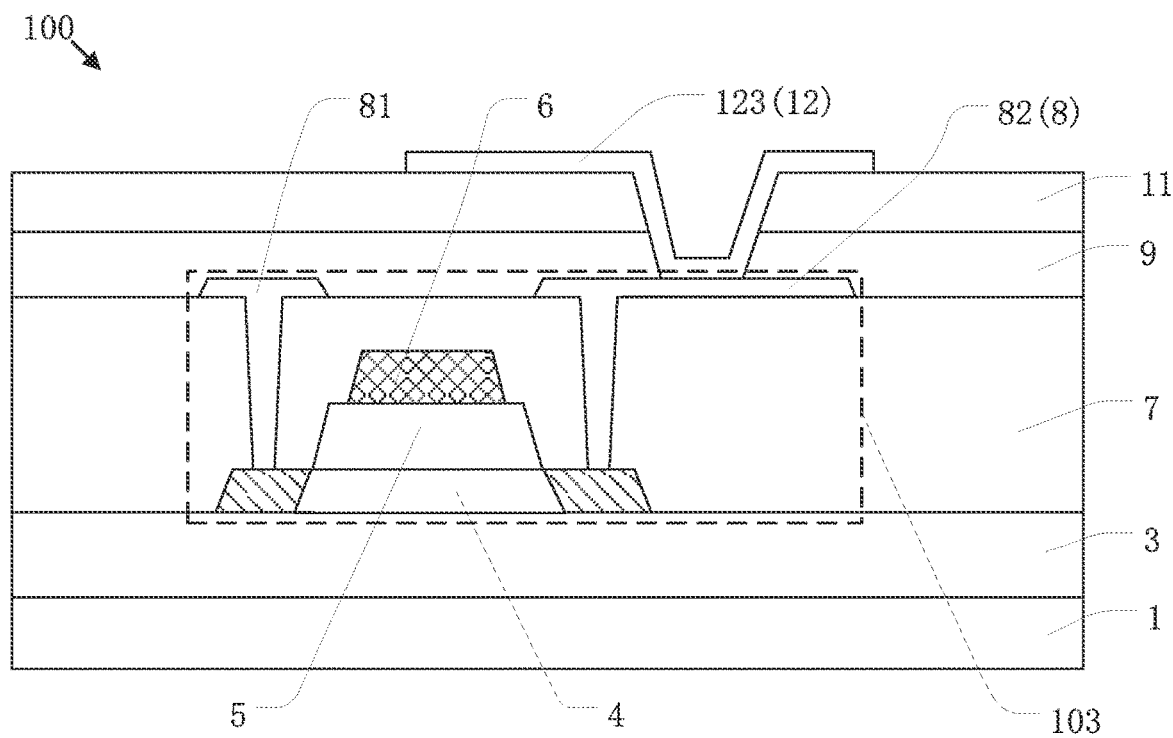
FIG. 6 is a structural schematic view showing the display device according to the embodiment of the present disclosure, which focuses on a structure of a third transistor device.

Please refer to FIG. 3. FIG. 3 is a structural schematic view showing the pixel driving circuit provided by the present disclosure. The pixel driving circuit having the 2T1C structure is as shown in FIG. 6. FIG. 6 only shows a principle of the pixel driving circuit having the 2T1C structure. The principle of the pixel driving circuit having the 2T1C structure is same as a principle of a pixel driving circuit having a 3T1C structure or a 7T1C structure. The pixel driving circuit includes a switch transistor T1, a driving transistor T2, a storage capacitor C, and a light-emitting component OLED. A gate of the switch transistor T1 is electrically connected to one of the scan lines 112. A drain electrode of the switch transistor T1 is electrically connected to one of the data lines 113. A source electrode of the switch transistor T1 is electrically connected to a gate of the driving transistor T2 and an end of the storage capacitor C. A drain electrode of the driving transistor T2 is electrically connected to another end of the storage capacitor C and inputs a first voltage signal VDD. A source electrode of the driving transistor T2 is electrically connected to a positive electrode of the light-emitting component OLED. A negative electrode of the light-emitting component OLED inputs a second voltage signal VSS. The driving transistor T2 has a same structure as the first transistor device 101 (see FIG. 4). Therefore, when a grayscale display is performed, a data signal Data inputted from the data lines 113 is converted into pixel electric charges and is stored in the storage capacitor C of the pixel driving circuit. A number of electrical charges stored in the storage capacitor C is increased, thereby preventing Vth of the pixel driving circuit from being negatively shifted.

Taking the gate driving circuit 111 having a 18T1C structure as shown in FIG. 2 as an example, the output pull-up module of the gate driving circuit 111 in the gate driving area 130 includes a transistor T21. The transistor T21 has a structure of the first transistor device 101 (see FIG. 4). The gate driving area 130 and the display area 110 are further provided with a second transistor device 102 (see FIG. 5) and/or a third transistor device 103 (see FIG. 6). The first transistor device 101, the second transistor device 102, and the third transistor device 103 are disposed on a same layer. A plurality of layers of the first transistor device 101, a plurality of layers of the second transistor device 102, and a plurality of layers of the third transistor device 103 correspond to each other. Preferably, the first transistor device 101 and the third transistor device 103 constitute the gate driving circuit 111. The second transistor device 102 and the third transistor device 103 constitute the pixel driving circuit. Of course, the gate driving circuit 111 and the pixel driving circuit may also be constituted by the first transistor device 101, second transistor device 102, and the third transistor device 103.

The display device 100 includes an array substrate. The array substrate includes a glass substrate 1, and the first transistor device 101, the second transistor device 102, and the third transistor device 103 which are disposed on the glass substrate 1.

Figure 4:
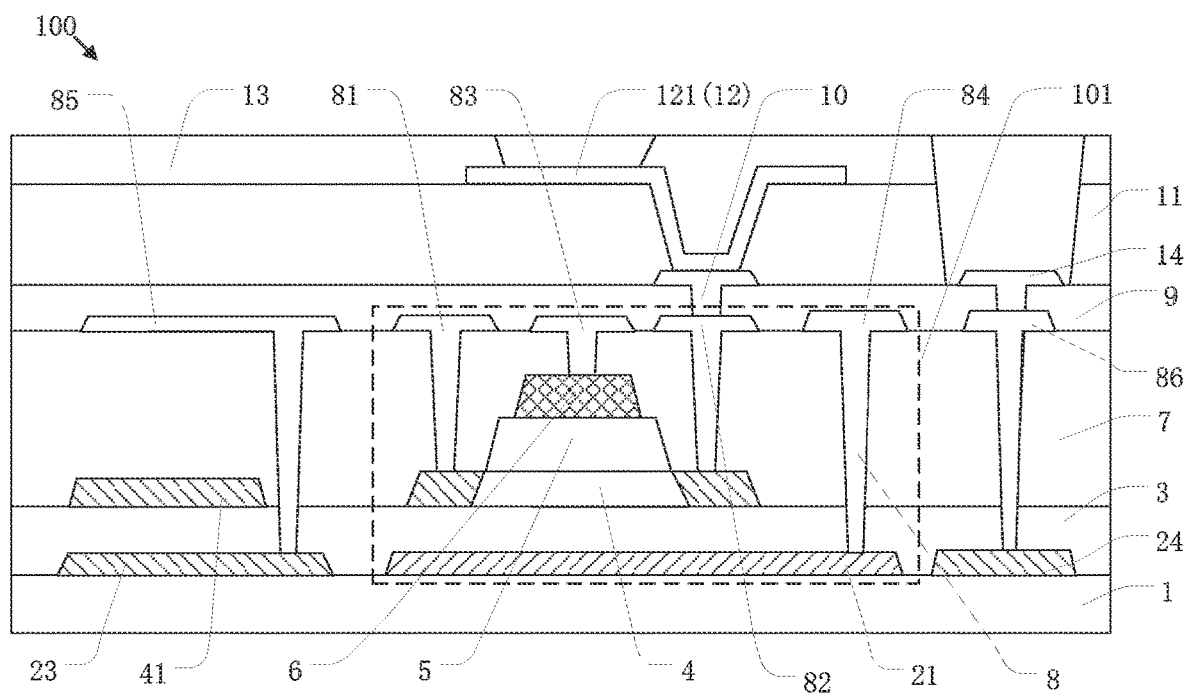
FIG. 4 is a structural schematic view showing the display device according to the embodiment of the present disclosure, which focuses on a structure of a first transistor device.

Please refer to FIG. 1 and FIG. 4, the first transistor device 101 includes a first metal layer 21, a buffer layer 3, an active layer 4, a gate insulating layer 5, a gate layer 6, an interlayer insulating layer 7, and a second metal layer 8. Specifically, the first metal layer 21 is disposed on the glass substrate 1. The buffer layer 3 is disposed on the glass substrate 1 and completely covers the first metal layer 21. The active layer 4 is disposed on the buffer layer 3 and corresponds to the first metal layer 21. The gate insulating layer 5 is disposed on the active layer 4. The gate layer 6 is disposed on the gate insulating layer 5 and corresponds to the active layer 4. The interlayer insulating layer 7 is disposed on the buffer layer 3 and completely covers the gate layer 6. The second metal layer 8 is disposed on the interlayer insulating layer 7. The second metal layer 8 includes a source electrode 81, a drain electrode 82, a first signal wire 83, and a second signal wire 84. The source electrode 81 is electrically connected to an end of the active layer 4. The drain electrode 82 is electrically connected to another end of the active layer 4. The first signal wire 83 is electrically connected to the gate layer 6 to form a top-gate structure and is configured to input a first gate signal. The second signal wire 84 is electrically connected to the first metal layer 21 to form a bottom-gate structure and is configured to input a second gate signal. The gate layer 6 and the first metal layer 21 constitute a double-gate structure which can provide a gate signal with a large current by only the second signal wire 84. Alternatively, the double-gate structure can provide a gate signal with a large current by both the first signal wire 83 and the second signal wire 84. Therefore, mobility of the active layer 4 is improved. Moreover, the first transistor device 101 has a relatively stable structure. Therefore, mobility and stability of Vth of the transistor devices in the gate driving area can be improved, and the driving circuit of the gate driving area will not be burned out due to an overly large current. As such, a value of a signal voltage of the first transistor device 101 can be increased, so that a value of a scan signal voltage Scan transmitted from the gate driving circuit 111 in the gate driving area 130 to the pixel driving circuit of the display area 110 can be increased.

In the present embodiment, the first signal wire 83 is electrically connected to the second signal wire 84. Meanwhile, the first gate signal and the second gate signal are same, are inputted into the scan line 112 together, and are transmitted into the pixel driving circuit in the pixel 114. Because the active layer 4 is disposed between the gate layer 6 and the first metal layer 21, it can be driven by a scan signal having a relatively small voltage. Therefore, a circuit breaking due to the gate driving circuit 111 being burned out due to negatively shifted voltage is prevented. Moreover, because the second signal wire 84 individually provides a gate signal having a large current, mobility of the active layer 4 can be effectively improved. As such, a voltage value of an outputted scan signal can be increased. As a result, more electric charges can be stored in the storage capacitor C in the pixel driving circuit of the pixel 114, and a discharge time can be extended.

In the present embodiment, a region of the buffer layer 3 and a region of the interlayer insulating layer 7 corresponding to an end of the first metal layer 21 are provided with a first through-hole. The second signal wire 84 is electrically connected to the first metal layer 21 by the first through-hole.

In the present embodiment, the array substrate further includes a passivation layer 9, a planarization layer 11, and a conductive layer 12. The passivation layer 9 is disposed on the interlayer insulating layer 7 and completely covers the second metal layer 8. The planarization layer 11 is disposed on the passivation layer 9. The conductive layer 12 includes a first anode wire 121, and the first anode wire 121 is disposed on the planarization layer 11 and is electrically connected to the drain electrode 82.

In the present embodiment, the array substrate further includes a line-changing layer 10 and a pixel-defining layer 13. The line-changing layer 10 is disposed on the passivation layer 9 and is electrically connected to the drain electrode 82. The planarization layer 11 is disposed on the passivation layer 9 and completely covers the line-changing layer 10. The conductive layer 12 is electrically connected to the line-changing layer 10. The pixel-defining layer 13 is disposed on the conductive layer 12.

Figure 5:
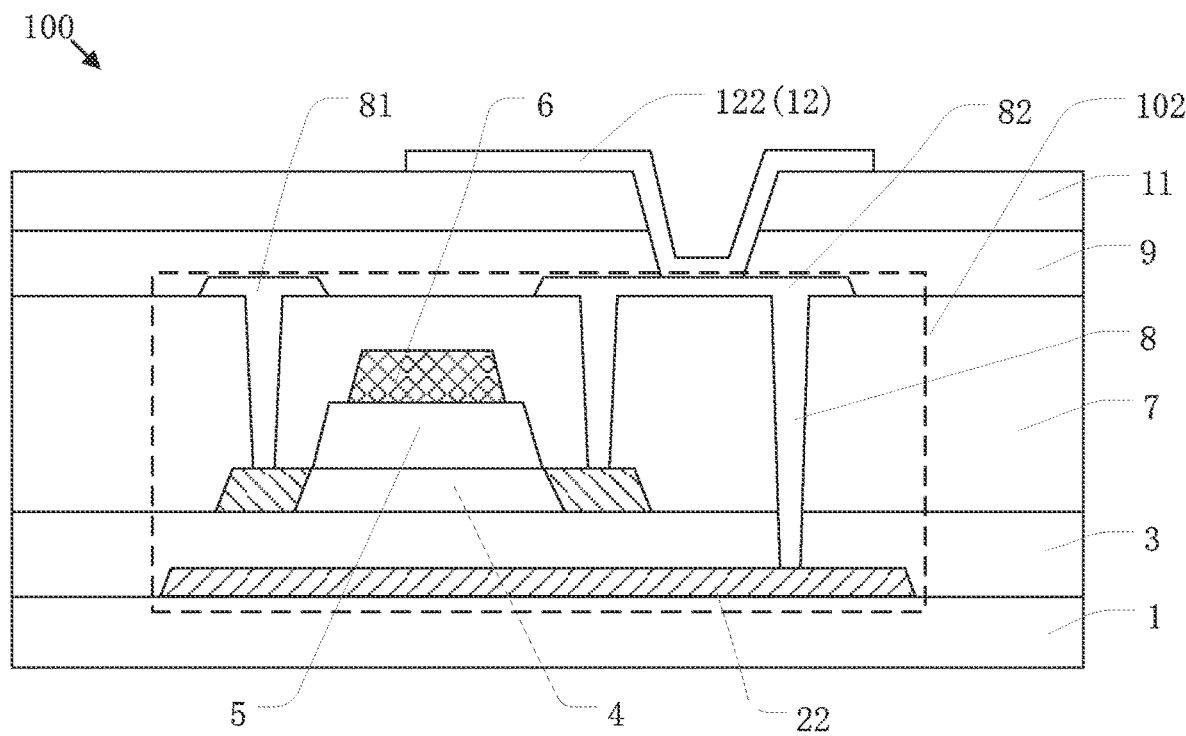
FIG. 5 is a structural schematic view showing the display device according to the embodiment of the present disclosure, which focuses on a structure of a second transistor device.

Please refer to FIG. 5. In the present embodiment, the second transistor device 102 includes a light-shielding layer 22, the buffer layer 3, the active layer 4, the gate insulating layer 5, the gate layer 6, the interlayer insulating layer 7, and the second metal layer 8. The light-shielding layer 22 is disposed on the glass substrate 1 and is disposed on a same layer as the first metal layer 21. The buffer layer 3 is disposed on the glass substrate 1 and completely covers the light-shielding layer 22. The active layer 4 is disposed on the buffer layer 3 and corresponds to the light-shielding layer 22. The gate insulating layer 5 is disposed on the active layer 4. The gate layer 6 is disposed on the gate insulating layer 5 and corresponds to the active layer 4. The interlayer insulating layer 7 is disposed on the buffer layer 3 and completely covers the gate layer 6. The second metal layer 8 is disposed on the interlayer insulating layer 7. The second metal layer 8 includes the source electrode 81 and the drain electrode 82. The source electrode 81 is electrically connected to an end of the active layer 4. The drain electrode 82 is electrically connected to another end of the active layer 4 and the light-shielding layer 22. The gate layer 6 and the light-shielding layer 22 are electrically connected to each other. Therefore, the light-shielding layer 22 can be conductive after currents flow through the gate layer. Because the active layer 4 is disposed between the gate layer 6 and the light-shielding layer 22, it can be driven by a scan signal having a relatively small voltage. As such, the gate driving circuit 111 can be prevented from a circuiting break due to negatively shifted voltage.

In the present embodiment, the array substrate corresponding to a position of the second transistor device 102 includes the passivation layer 9, the planarization layer 11, and the conductive layer 12. The passivation layer 9 is disposed on the interlayer insulating layer 7 and completely covers the second metal layer 8. The planarization layer 11 is disposed on the passivation layer 9. The conductive layer 12 includes a second anode wire 122. The second anode wire 122 is disposed on the planarization layer 11 and is electrically connected to the drain electrode 82.

Please refer to FIG. 6. In the present embodiment, the third transistor device 103 in the gate driving area 130 and the display area 110 includes the active layer 4, the gate insulating layer 5, the gate layer 6, the interlayer insulating layer 7, and the second metal layer 8. The active layer 4 is disposed on the buffer layer 3 and corresponds to the first metal layer 21. The gate insulating layer 5 is disposed on the active layer 4. The gate layer 6 is disposed on the gate insulating layer 5 and corresponds to the active layer 4. The interlayer insulating layer 7 is disposed on the buffer layer 3 and completely covers the gate layer 6. The second metal layer 8 is disposed on the interlayer insulating layer 7. The second metal layer 8 includes the source electrode 81 and the drain electrode 82. The source electrode 81 is electrically connected to an end of the active layer 4. The drain electrode 82 is electrically connected to another end of the active layer 4. It should be understood that the third transistor device 103 does not include the light-shielding layer 22. Therefore, manufacturing steps of the array substrate can be simplified, which is beneficial for reducing a thickness of layers.

In the present embodiment, the array substrate corresponding to a position of the third transistor device 103 includes the passivation layer 9, the planarization layer 11, and the conductive layer 12. The passivation layer 9 is disposed on the interlayer insulating layer 7 and completely covers the second metal layer 8. The planarization layer 11 is disposed on the passivation layer 9. The conductive layer 12 includes a third anode wire 123. The third anode wire 123 is disposed on the planarization layer 11 and is electrically connected to the drain electrode 82.

In the present embodiment, in the gate driving area 130, the first metal layer 21 includes a first capacitor electrode plate 23, the second metal layer 8 includes a second capacitor electrode plate 85, and the active layer 4 includes a third capacitor electrode plate 41. The first capacitor electrode plate 23 is electrically connected to the second capacitor electrode plate 85. The third capacitor electrode plate 41 is correspondingly disposed between the first capacitor electrode plate 23 and the second capacitor electrode plate 85 to form a capacitor.

In the present embodiment, in the gate driving area 130, the first metal layer 21 includes a first gasket wire 24, and the second metal layer 8 includes a second gasket wire 86. The second gasket wire 86 is disposed above the first gasket wire 24 and is electrically connected to the first gasket wire 24. The first transistor device 101 further includes a third gasket wire 14. The third gasket wire 14 is disposed above the second gasket wire 86 and is electrically connected to the second gasket wire 86 to form a bonding connecting gasket. In a position corresponding to the bonding connecting gasket, the pixel defining layer 13 is further provided with a recess defined on a top surface of the bonding connecting gasket.

It should be noted that the first metal layer 21, the light-shielding layer 22, the first capacitor electrode plate 23, and the first gasket wire 24 are disposed on a same layer and are formed by patterning a layer of metal. The source electrode 81, the drain electrode 82, the first signal wire 83, the second signal wire 84, the second capacitor electrode plate 85, and the second gasket wire 86 are disposed on a same layer and are part of the second metal layer 8. The first anode wire 121, the second anode wire 122, and the third anode wire 123 are disposed on a same layer and are part of the conductive layer 12. Therefore, the first transistor device 101, the second transistor device 102, and the third transistor device 103 can be manufactured in the gate driving area 130 and the display area 110 at the same time, thereby improving manufacturing efficiency.

The present disclosure further provides a manufacturing method of the above-mentioned display device 100, including following steps:

(1) Cleaning the glass substrate 1, depositing a metal layer with a thickness ranging from 500 Å to 2000 Å, and patterning the metal layer to form a first metal layer 21, a light-shielding layer 22, a first capacitor electrode plate 23, and a first gasket wire 24, wherein a material of the metal layer may be Mo, Al, Cu, Ti, or alloys.

(2) Depositing a layer of SiOX, a layer of SiNx, or a thin film having multiple layers to form a buffer layer 3 with a thickness ranging from 1000 Å to 2000 Å.

(3) Depositing a layer of a metal oxide semiconductor material to form a semiconductor layer, and etching the semiconductor layer to form a pattern, wherein the metal oxide semiconductor material may be IGZO, IZTO, or IGZTO, and a thickness of the layer of the metal oxide semiconductor material ranges from 100 Å to 1000 Å.

(4) Depositing a layer of SiOx, a layer of SiNx, or a thin film having multiple layers to form a gate insulating layer 5 with a thickness ranging from 1000 Å to 3000 Å.

(5) Depositing a layer of metal to form a gate layer 6, wherein the metal may be Mo, Al, Cu, Ti, alloys, or a Mo/Al/Mo stacked structured with a thickness ranging from 2000 Å to 8000 Å.

(6) Etching the gate layer 6 by photolithography to form a pattern, and etching the gate insulating layer 5 with respect to the pattern of the gate layer 6, wherein only the gate insulating layer 5 below layers of the pattern of the gate layer 6 is retained, and the gate insulating layer 5 in another place is etched.

(7) Performing a plasma process on an entire surface, wherein electrical resistance of a semiconductor layer without the gate insulating layer 5 and the gate layer 6 disposed thereabove is significantly reduced after the plasma process. An N+ conductive layer is formed. A semiconductor layer disposed below the gate insulating layer 5 is not processed, so that it retains properties of semiconductors and forms a thin-film transistor (TFT) channel, thereby forming an active layer 4.

(8) Depositing an interlayer insulating layer 7, wherein the interlayer insulating layer 7 is SiOx, SiNx, or a thin film including a plurality of layers with a thickness ranging from 2000 Å to 10000 Å.

(9) Performing a photolithography process and an etching process to define a contact hole configured to transmit signals between the first metal layer 21 and the light-shielding layer 22, and performing a photolithography process and an etching process on the interlayer insulating layer 7 to defined a contact hole corresponding to the gate layer 6.

(10) Depositing a metal layer to form a second metal layer 8, wherein the metal layer may be Mo, Al, Cu, Ti, alloys, or a Mo/Al/Mo stacked structure with a thickness ranging from 2000 Å to 8000 Å. The second metal layer 8 includes a first signal wire 83 and a second signal wire 84. In the gate driving area 130, the first signal wire 83 is electrically connected to the gate layer 6, and the second signal wire 84 is electrically connected to the first metal layer 21. Other parts are manufactured according to a normal process. Then, defining a pattern.

(11) Depositing a passivation layer 9, and depositing a layer of SiOx thin film with a thickness ranging from 1000 Å to 5000 Å.

(12) Manufacturing a planarization layer 11, and defining an opening on a position where a pixel electrode is connected.

(13) Finally, manufacturing a conductive layer 12 and patterning it to form the pixel electrode. Therefore, a backplate, which can be used to manufacture a display device 100 of a liquid crystal display (LCD) or an organic light-emitting diode (OLED), is formed.

Figure 7:
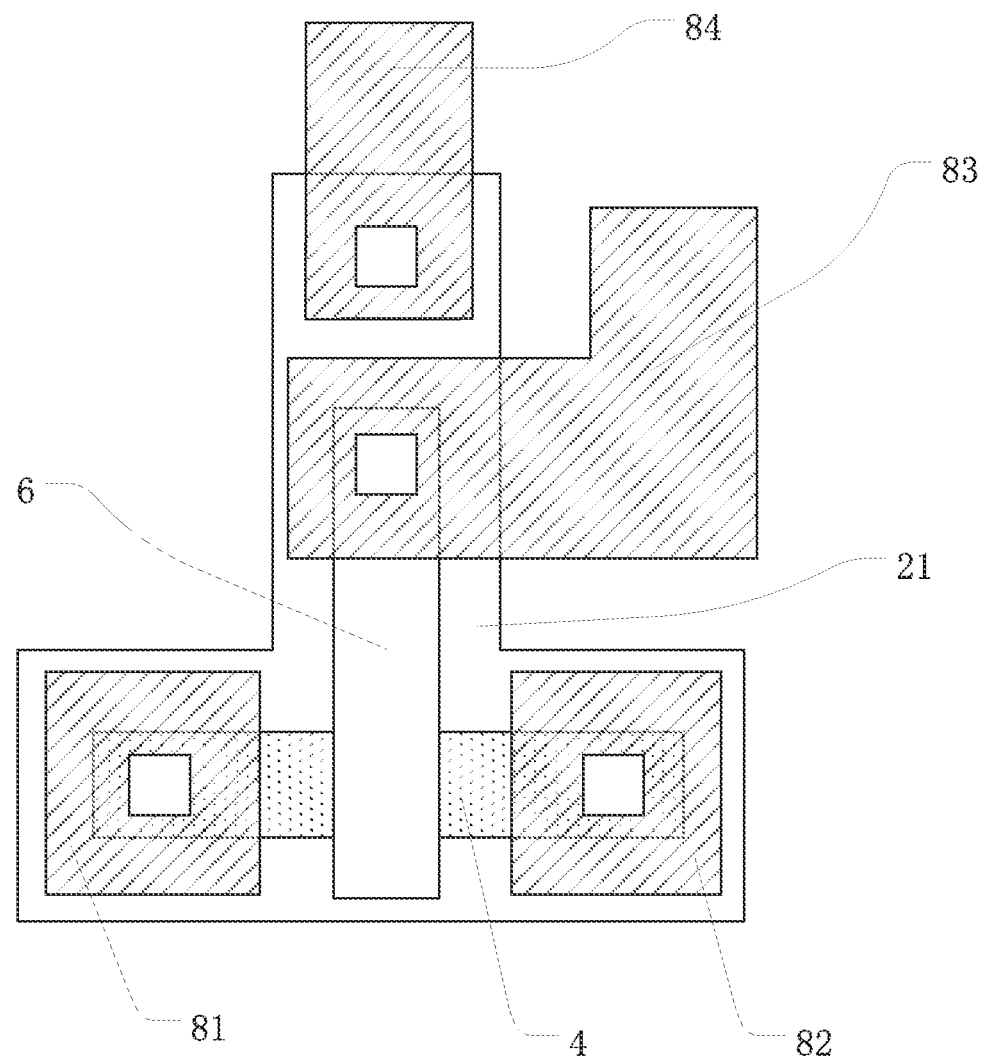
FIG. 7 is a plan structural schematic view showing the structure of the first transistor device when it is manufactured.

Please refer to FIG. 7. FIG. 7 is a plan structural schematic view showing a structure of the first transistor device 101 when it is formed.

Based on a same inventive idea, an embodiment of the present disclosure provides a display panel, including the above-mentioned display device 100. In the present embodiment, the display device may be a mobile phone, a tablet, a television, a display, a laptop, a digital frame, a navigator, or any products or components with a display function.

A working principle of the display panel provided by the present embodiment is same as a working principle of the above-mentioned display device 100. A specific structure and a working principle can be referred to the above-mentioned display device and are not described here again.

The present disclosure provides a display device. In the display device, a first transistor device of an output pull-up module of a gate driving circuit in a gate driving area is provided with a first signal wire and a second signal wire. The first signal wire is electrically connected to a gate layer. The second signal wire is electrically connected to a first metal layer. As a result, a double-gate structure is formed. The double-gate structure can provide a gate signal with a large current by only the second signal wire. Also, the double-gate structure can provide a gate signal with a large current by both of the first signal wire and the second signal wire, thereby improving mobility of the active layer. Moreover, the above transistor device has a relatively stable structure. Therefore, mobility and stability of Vth of the transistor devices in the gate driving area can be improved, and the driving circuit of the gate driving area will not be burned out due to an overly large current. As such, a signal voltage value of the first transistor device can be increased, so that a scan signal voltage value transmitted from the gate driving area to the display area can be increased.

The above are merely preferred embodiments of the present invention. It is understood that many changes and modifications to the described embodiment can be carried out without departing from the scope and the spirit of the disclosure that is intended to be limited only by the appended claims.

What is claimed is:

1. A display device, comprising a display area and a non-display area surrounding a periphery of the display area, wherein the non-display area is provided with a gate driving area, the gate driving area comprises a gate driving circuit configured to drive the display area, the gate driving circuit comprises an output pull-up module, the output pull-up module comprises a first transistor device, and the first transistor device comprises:

a first metal layer;
a buffer layer disposed on the first metal layer;
an active layer disposed on the buffer layer and corresponding to the first metal layer;
a gate insulating layer disposed on the active layer;
a gate layer disposed on the gate insulating layer and corresponding to the active layer;
an interlayer insulating layer disposed on the buffer layer and completely covering the gate layer; and
a second metal layer disposed on the interlayer insulating layer, wherein the second metal layer comprises a source electrode, a drain electrode, a first signal wire, and a second signal wire; the source electrode is electrically connected to an end of the active layer, the drain electrode is electrically connected to another end of the active layer, the first signal wire is electrically connected to the gate layer to form a top-gate structure and is configured to input a first gate signal, and the second signal wire is electrically connected to the first metal layer to form a bottom-gate structure and is configured to input a second gate signal;

wherein the gate driving area comprises a first capacitor electrode plate, the first capacitor electrode plate and the first metal layer are disposed on a same layer, the second metal layer comprises a second capacitor electrode plate, the active layer comprises a third capacitor electrode plate, the first capacitor electrode plate is electrically connected to the second capacitor electrode plate, and the third capacitor electrode plate is correspondingly disposed between the first capacitor electrode plate and the second capacitor electrode plate to form a capacitor.

2. The display device of claim 1, wherein the first signal wire is electrically connected to the second signal wire.

3. The display device of claim 2, wherein the first gate signal and the second gate signal are same.

4. The display device of claim 1, wherein positions of the buffer layer and the interlayer insulating layer corresponding to an end of the first metal layer are provided with a first through-hole, and the second signal wire is electrically connected to the first metal layer by the first through-hole.

5. The display device of claim 4, wherein the gate driving circuit further comprises:
an input module, wherein the input module comprises a first output terminal, and the first output terminal outputs the first gate signal and the second gate signal to the output pull-up module.

6. The display device of claim 5, wherein the gate driving circuit further comprises:
an output pull-down module electrically connected to the output pull-up module.

7. The display device of claim 6, wherein the gate driving circuit further comprises:
a scan signal output terminal disposed between the output pull-down module and the output pull-up module and configured to output a scan signal to the display area.

8. The display device of claim 7, wherein the first signal wire and the second signal wire of the first transistor device are electrically connected to the first output terminal of the input module, the drain electrode of the first transistor device inputs a clock signal, and the source electrode of the first transistor device is electrically connected to the scan signal output terminal and the output pull-down module.

9. The display device of claim 6, wherein the display area of the display device is provided with a plurality of scan lines and a plurality of data lines crossing the scan lines, a plurality of regions surrounded by the scan lines and the data lines are provided with a plurality of pixels distributed in an array manner, and each of the gate driving circuits is electrically connected to the pixels by one of the scan lines.

10. The display device of claim 9, wherein each of the pixels comprises a pixel driving circuit, and the gate driving circuit and the scan lines are electrically connected to each other to transmit the scan signal to the pixel driving circuit.

11. The display device of claim 10, wherein the pixel driving circuit comprises a switch transistor, a driving transistor, a storage capacitor, and a light-emitting component; a gate of the switch transistor is electrically connected to one of the scan lines, a drain electrode of the switch transistor is electrically connected to one of the data lines, a source electrode of the switch transistor is electrically connected to a gate of the driving transistor and an end of the storage capacitor, a drain electrode of the driving transistor is electrically connected to another end of the storage capacitor and inputs a first voltage signal, a source electrode of the driving transistor is electrically connected to a positive electrode of the light-emitting component, a negative electrode of the light-emitting component inputs a second voltage signal, and the driving transistor has a same structure as the first transistor device.

12. The display device of claim 11, wherein the gate driving area and the display area are further provided with a second transistor device, and the second transistor device corresponds to a plurality of layers of the first transistor device;
the gate driving circuit further comprises the input module, a voltage stabilizing module, the output pull-down module, a pull-down control module, and a feedback module, and a transistor of the input module, a transistor of the output pull-down module, a transistor of the pull-down control module, a transistor of the feedback module, and a transistor of the pixel driving circuit have a same structure as the second transistor device; and
the second transistor device comprises:
a light-shielding layer disposed on a same layer as the first metal layer;
the buffer layer disposed on the light-shielding layer;
the active layer disposed on the buffer layer and corresponding to the light-shielding layer;
the gate insulating layer disposed on the active layer;
the gate layer disposed on the gate insulating layer and corresponding to the active layer;
the interlayer insulating layer disposed on the buffer layer and completely covering the gate layer; and
the second metal layer disposed on the interlayer insulating layer, wherein the second metal layer comprises the source electrode and a drain electrode, the source electrode is electrically connected to the end of the active layer, and the drain electrode is electrically connected to another end of the active layer and the light-shielding layer.

13. The display device of claim 11, wherein the gate driving area and the display area are further provided with a third transistor device, and the third transistor device corresponds to a plurality of layers of the first transistor device;
the gate driving circuit further comprises the input module, a voltage stabilizing module, the output pull-down module, a pull-down control module, and a feedback module, and a transistor of the input module, a transistor of the output pull-down module, a transistor of the pull-down control module, a transistor of the feedback module, and a transistor of the pixel driving circuit have a same structure as the third transistor device; and
the third transistor device comprises:
the active layer disposed on the buffer layer and corresponding to the first metal layer;
the gate insulating layer disposed on the active layer;
the gate layer disposed on the gate insulating layer and corresponding to the active layer;
the interlayer insulating layer disposed on the buffer layer and completely covering the gate layer; and
the second metal layer disposed on the interlayer insulating layer, wherein the second metal layer comprises a source electrode and a drain electrode, the source electrode is electrically connected to an end of the active layer, and the drain electrode is electrically connected to another end of the active layer and the light-shielding layer.

14. The display device of claim 11, wherein the gate driving area and the display area are further provided with a second transistor device and a third transistor device, and the second transistor device and the third transistor device correspond to a plurality of layers of the first transistor device;
the gate driving circuit further comprises the input module, a voltage stabilizing module, the output pull-down module, a pull-down control module, and a feedback module, and a transistor of the input module, a transistor of the output pull-down module, a transistor of the pull-down control module, a transistor of the feedback module, and a transistor of the pixel driving circuit have a same structure as the second transistor device or the third transistor device;
the second transistor device comprises:
a light-shielding layer disposed on a same layer as the first metal layer;
the buffer layer disposed on the light-shielding layer;

the active layer disposed on the buffer layer and corresponding to the light-shielding layer;

the gate insulating layer disposed on the active layer;

the gate layer disposed on the gate insulating layer and corresponding to the active layer;

the interlayer insulating layer disposed on the buffer layer and completely covering the gate layer; and the second metal layer disposed on the interlayer insulating layer, wherein the second metal layer comprises a source electrode and a drain electrode, the source electrode is electrically connected to an end of the active layer, and the drain electrode is electrically connected to another end of the active layer and the light-shielding layer; and wherein the third transistor device comprises:

the active layer disposed on the buffer layer and corresponding to the first metal layer;

the gate insulating layer disposed on the active layer;

the gate layer disposed on the gate insulating layer and corresponding to the active layer;

the interlayer insulating layer disposed on the buffer layer and completely covering the gate layer; and the second metal layer disposed on the interlayer insulating layer, wherein the second metal layer comprises a source electrode and a drain electrode, the source electrode is electrically connected to an end of the active layer, and the drain electrode is electrically connected to another end of the active layer and the light-shielding layer.

15. The display device of claim 1, wherein the first capacitor electrode plate and the first metal layer are simultaneously formed, and a thickness of the first capacitor electrode plate and a thickness of the first metal layer range from 500 Å to 2000 Å.

16. The display device of claim 1, wherein a material of the first capacitor electrode plate and a material of the first metal layer comprise one or more of Mo, Al, Cu, and Ti.

17. The display device of claim 1, wherein a thickness of the second metal layer and a thickness of the second capacitor electrode plate range from 2000 Å to 8000 Å, and a material of the second metal layer and a material of the second capacitor electrode plate comprise one or more of Mo, Al, Cu, and Ti, or the second metal layer and the second capacitor electrode plate comprises a stacked-layer structure of Mo/Al/Mo.

18. The display device of claim 1, wherein a thickness of the active layer and a thickness of the third capacitor electrode plate range from 100 Å to 1000 Å, and a material of the active layer and a material of the third capacitor electrode plate comprise IGZO, ITZO, or IGZTO.

19. The display device of claim 1, wherein the gate driving area comprises a first gasket wire, the first gasket wire and the first metal layer are disposed on a same layer, the second metal layer comprises a second gasket wire, the second gasket wire is disposed above the first gasket wire and is electrically connected to the first gasket, the first transistor device further comprises a third gasket wire, and the third gasket wire is disposed above the second gasket wire and is electrically connected to the second gasket wire to form a bonding connecting gasket.

20. A display device, comprising a display area and a non-display area surrounding a periphery of the display area, wherein the non-display area is provided with a gate driving area, the gate driving area comprises a gate driving circuit configured to drive the display area, the gate driving circuit comprises an output pull-up module, the output pull-up module comprises a first transistor device, and the first transistor device comprises:

a first metal layer;

a buffer layer disposed on the first metal layer;

an active layer disposed on the buffer layer and corresponding to the first metal layer;

a gate insulating layer disposed on the active layer;

a gate layer disposed on the gate insulating layer and corresponding to the active layer;

an interlayer insulating layer disposed on the buffer layer and completely covering the gate layer; and a second metal layer disposed on the interlayer insulating layer, wherein the second metal layer comprises a source electrode, a drain electrode, a first signal wire, and a second signal wire; the source electrode is electrically connected to an end of the active layer, the drain electrode is electrically connected to another end of the active layer, the first signal wire is electrically connected to the gate layer to form a top-gate structure and is configured to input a first gate signal, and the second signal wire is electrically connected to the first metal layer to form a bottom-gate structure and is configured to input a second gate signal;

wherein the gate driving area comprises a first gasket wire, the first gasket wire and the first metal layer are disposed on a same layer, the second metal layer comprises a second gasket wire, the second gasket wire is disposed above the first gasket wire and is electrically connected to the first gasket, the first transistor device further comprises a third gasket wire, and the third gasket wire is disposed above the second gasket wire and is electrically connected to the second gasket wire to form a bonding connecting gasket.

* * * * *